June 20, 1961 D. L. COX 2,989,670

TRANSISTOR

Filed June 19, 1956

INVENTOR

Douglas L. Cox

BY Stevens, Davis, Miller and Mosher

ATTORNEYS 2,989,670
Patented June 20, 1961

2,989,670
TRANSISTOR

Douglas L. Cox, Irving, Tex., assignor to Texas Instruments Incorporated, Dallas, Tex., a corporation of Delaware Filed June 19, 1956, Ser. No. 592,383
3 Claims. (Cl. 317—235)

The present invention relates to a technique for making alloy transistors of either the npn or pnp type and to the article produced.

Heretofore, alloy transistors were made from small thin wafers of semiconductor material of one conductivity type, either n or p. These wafers were usually from 70 to 200 mils square and ordinarily no more than 6 mils thick in their finished form. The necessary junctions for transistor action were obtained by fusing or alloying into each side of the wafer a smaller amount of impurity material producing a small area of semiconductor material of a conductivity type opposite that of the body of the wafer. Wires were then attached to each impurity area for the emitter and collector connections and to the wafer for the base connection to complete the transistor. To achieve proper transistor action, the wafer used had to be extremely thin with the result that losses were quite high from breakage. Also, the dots, as the bits of impurity material are called, had to be positioned as closely as possible in alinement with each other on opposite sides of the wafer. Quite often, inferior transistors resulted when the dots became misalined in transporting the assembly from the assembly point to the furnace for the alloying step of the process.

By the present invention, these difficulties are obviated in that the wafer is uniquely etched in the region in which the dots are to be alloyed to reduce thickness of the wafer at these points only. Thus the wafer does not lose its structural strength. Also, the unique etching treatment of the present invention greatly reduces the chances of the dots becoming misalined before they can be alloyed into the wafers. If is, accordingly, one object of the present invention to provide a technique for treating transistor wafers and for making the appropriate connections which will accomplish the desired results without weakening the transistor to an appreciable extent. Use of the technique enables the collector and the emitter electrodes to be alloyed to the wafer perfectly alined and on opposite sides of a thin section.

It is a further object of the present invention to provide a technique for producing alloyed transistors which is simple, reliable, and exceedingly economical.

Other objects and advantages of the present invention will become more readily apparent from the following detailed description when taken in conjunction with the drawings in which.

Figure 1:
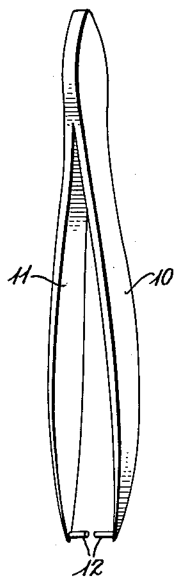
FIGURE 1 is a view in perspective of tweezers which are employed in the handling of the transistor wafers.

Referring now to the drawings in detail, a preferred embodiment of the invention will be described. A semiconductor wafer of either silicon or germanium is mounted in the tweezers shown in FIGURE 1. The tweezers are of bifurcated design being composed of tongs 10 and 11 which are joined together at one end and which are bowed to provide the necessary measure of resiliency. At the free end of the tongs 10 and 11 are mounted pins 12 in alinement so that, if the tongs 10 and 11 are clasped together, the pins 12 will strike against each other and be in an end-to-end relationship. In repose the pins 12 are spaced apart less than the thickness of the transistor wafer.

Figure 2:
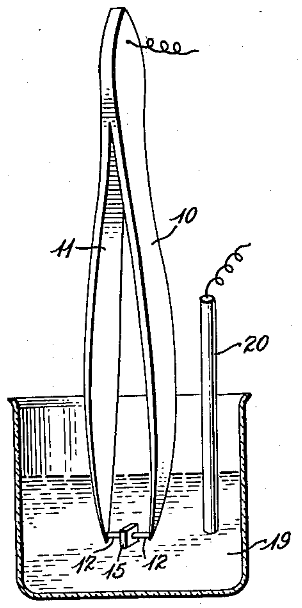
FIGURE 2 is a view in perspective showing a transistor wafer mounted in the tweezers and located in a plating bath.

A transistor wafer designated by the numeral 15 in FIGURE 2 is positioned between the pins 12 so that the pins strike the wafer approximately at its center. The wafer 15 will be of p-type conductivity if the finished transistor is to be an n-p-n type or, it will be of n-type conductivity if the finished transistor is to be a p-n-p type. After the wafer has been positioned, the tweezers and wafer are immersed in a gold plating bath 19 as depicted in FIGURE 2. The gold plating path contains, in solution, an impurity element such as, for example, gallium, indium, thallium or aluminum, which will produce p-type conductivity if the wafer to be plated is of p-type conductivity, or the bath will contain an n-type conductivity producing element, such as, for example, antimony, arsenic, phosphorus, or bismuth, if the wafer is of an n-type conductivity. Such an n-type bath may be composed essentially of 30 grams per liter of gold cyanide, 30 grams per liter of potassium ferricyanide, 8 grams per liter of potassium cyanide, and 0.5 gram per liter of potassium antimony tartrate. For a p-type bath, 0.5 gram per liter of indium chloride may be substituted for the 0.5 gram per liter of potassium antimony tartrate in the above plating bath. The specific coating or plating solution given is merely by way of example and of course others can be found that are equally suitable.

With the wafer 15 immersed in the bath, a gold anode 20 is introduced and appropriate electrical connections are made to the gold anode 20 using the wafer as a cathode. Gold antimony from the n-type bath or gold indium from the p-type bath is plated onto the wafer until a coating 17 approximately 0.3 mil in thickness results. As will be evident, the coating will cover the entire surface of the wafer 15 except the areas protected by the pins 12. The important consideration is that the coating material, be it of gold antimony, gold indium, or something else, is not attacked by the etchant in the subsequent step of the technique and hence functions as an etching mask.

Figure 3:
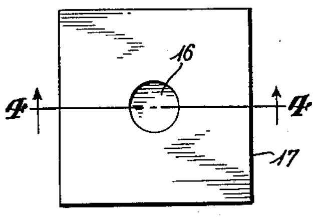
FIGURE 3 is a top plan view of a transistor wafer as it appears after removal from the plating bath.
Figure 4:
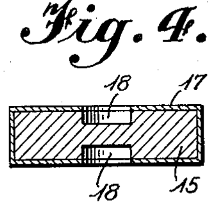
FIGURE 4 is a view in section taken along line 4—4 of FIGURE 3, showing the wafer after being etched.

After plating, the wafer is removed from the plating bath, washed and immersed in a suitable etchant such as, for example, the well known CP–4, a mixture of hydrochloric acid, hydrofluoric acid, acetic acid, and bromine. Since gold is immune to the etchant, all of the action will occur in the unprotected or uncoated area at the center portion of the wafer, namely, in the circular regions designated by the numeral 16 in FIGURE 3. As a result of etching, the section of the wafer in the uncoated areas will be greatly reduced, and circular recesses 18 in perfect alinement will be formed. The etching can be carried out to produce an exceedingly thin section without effecting the strength of the wafer. Sufficient bulk remains intact so that, for all intents and purposes, the wafer is rugged as before etching took place.

To form the emitter and collector regions dots 21 are placed on the wafer in the circular recesses 18. It will be appreciated that the dots will be of a p-type conductivity material, for example, indium, if the conductivity of the wafer is n-type or, if the wafer is p-type, that the dots will be of an n-type conductivity material such as lead-antimony. The formation of the recesses 18 inherently leads to proper dot alinement. After alloying, wires are soldered to the dots to form the electrical leads to the emitter and the collector. The coating 17 serves as a ring type base connection which is etch resistant and the base lead can be conveniently soldered directly to this coating.

Often a final etching step is necessary to remove edge portions of the dot material which may be in contact with, but not alloyed to, the wafer material and thus causing a short between the collector or emitter and the base.

Figure 5:
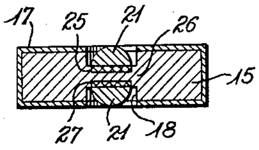
FIGURE 5 is a view in section similar to FIGURE 4, showing a transistor wafer after plating and etching with the collector and emitter region alloyed thereto and ready to receive suitable leads.

For completeness, the emitter, base and collector sections of the wafer, designated by the reference numerals 25, 26 and 27 respectively are shown in FIGURE 5.

By virtue of the technique offered by the present invention the wafers are very easy to handle since only the portion under the dots is etched to the thin section necessary for good transistor characteristics. Also the characteristics of the transistor are enhanced by the perfect dot alinement achieved through the method of this invention.

Although the present invention has been described in terms of a preferred embodiment, various changes and modifications such as multiple tweezer clamps, different plating solutions, and others obvious to those skilled in the art are within the spirit, scope and contemplation of the invention in its broadest aspects. It is intended, therefore, that this invention be limited only as set forth in the appended claims.

What is claimed is:

1. A transistor comprising a wafer of one conductivity type semiconductor material having recesses defined on opposite surfaces thereof and in alinement, a base contact comprising a coating of gold containing an element producing said one conductivity type covering the entire surface of said wafer with the exception of said recesses, and emitter and collector contacts comprising dots containing an element producing a conductivity type opposite said one conductivity type located in said recesses and alloyed to said wafer.

2. A transistor comprising a germanium wafer of n-type conductivity having recesses defined on opposite faces thereof and in alinement, a base contact comprising a coating of gold-antimony covering the entire surface of said wafer with the exception of said recesses, and emitter and collector contacts comprising indium dots located in said recesses and alloyed to said wafer.

3. A transistor as defined in claim 2 further comprising leads affixed to said base, emitter and collector contacts.

References Cited in the file of this patent

UNITED STATES PATENTS

| | | |
|---|---|---|
| 2,653,374 | Mathews et al. | Sept. 29, 1953 |
| 2,697,269 | Fuller | Dec. 21, 1954 |
| 2,713,132 | Mathews et al. | July 12, 1955 |
| 2,748,235 | Wallace | May 29, 1956 |
| 2,764,642 | Shockley | Sept. 25, 1956 |
| 2,770,763 | Mathews | Nov. 13, 1956 |
| 2,779,877 | Lehovec | Jan. 29, 1957 |
| 2,794,846 | Fuller | June 4, 1957 |
| 2,802,159 | Stump | Aug. 6, 1957 |
| 2,829,422 | Fuller | Apr. 8, 1958 |
| 2,862,160 | Ross | Nov. 25, 1958 |
| 2,866,140 | Jones et al. | Dec. 23, 1958 |
| 2,885,571 | Williams et al. | May 5, 1959 |